United States Patent

Masuta

[11] Patent Number: 6,140,878
[45] Date of Patent: Oct. 31, 2000

[54] TRANSIMPEDANCE-TYPE AMPLIFIER CIRCUIT WITH INTERCHANGEABLE RESISTANCE

[75] Inventor: Tomoaki Masuta, Tokyo, Japan

[73] Assignee: NEC Corporation, Tokyo, Japan

[21] Appl. No.: 09/320,960

[22] Filed: May 27, 1999

[30] Foreign Application Priority Data

May 28, 1998 [JP] Japan .................................. 10-147969

[51] Int. Cl.[7] .................................................... H03F 3/08
[52] U.S. Cl. .............................. 330/308; 330/86; 330/110
[58] Field of Search ....................... 250/214 A, 214 AG; 330/85, 86, 110, 282, 308

[56] References Cited

U.S. PATENT DOCUMENTS 5,801,588 9/1998 Nishiyama ................................ 330/308
5,821,814 10/1998 Katayama et al. .................. 330/110 X
5,952,887 9/1999 Katayanagi et al. ..................... 330/308

FOREIGN PATENT DOCUMENTS

9-8563   1/1997   Japan .

Primary Examiner—Steven J. Mottola
Attorney, Agent, or Firm—Scully, Scott, Murphy & Presser

[57] ABSTRACT

A transimpedance-type amplifier circuit includes a first resistor connected to a switching device and a second resistor connected with the first resistor in parallel with the switching device which is turned on in accordance with a result obtained by comparing an output from an inverting amplifier with a reference voltage. A diode is connected in parallel with the first resistor which is connected to the switching device, altering a feedback resistance constituted of these components. The diode maintains a terminal voltage across the first resistor to constant, and an optical current signal from a photodiode is therefore passed to discharge an electric charge accumulated in the parasitic capacitance of the photodiode.

10 Claims, 7 Drawing Sheets

TRANSIMPEDANCE-TYPE AMPLIFIER CIRCUIT WITH INTERCHANGEABLE RESISTANCE

BACKGROUND OF THE INVENTION

1. Field of the Invention

The present invention relates to a transimpedance-type amplifier circuit capable of interchanging a resistance in response to the amplitude of an output signal from the amplifier, and, more specifically to a transimpedance-type amplifier circuit for amplifying an output signal from a photodetector.

2. Description of the Related Art

Figure 7:
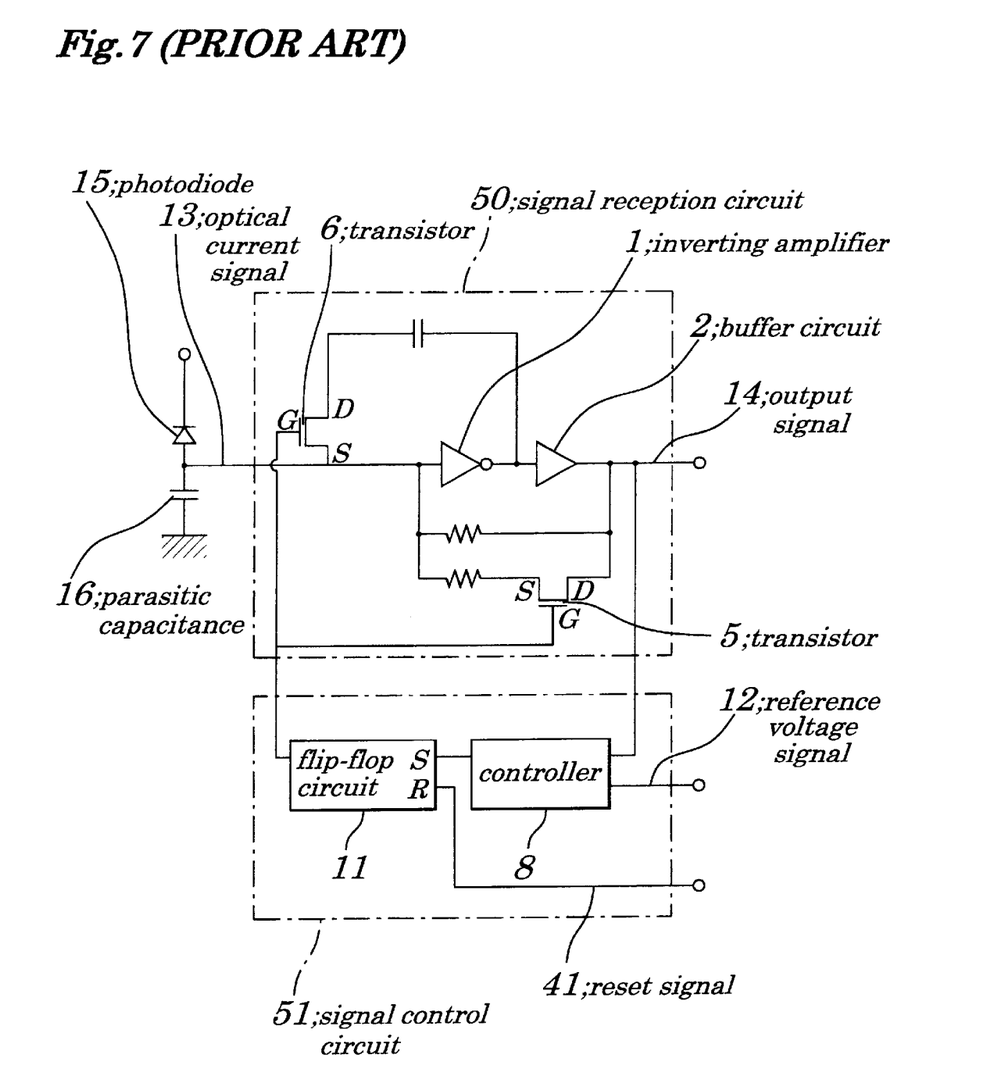
FIG. 7 is a circuit diagram showing a transimpedance-type amplifier circuit as related prior art.

A transimpedance-type amplifier circuit for amplifying an output signal from a photodetector has been proposed in Japanese Patent Application Laid-Open No. Hei9-008563 entitled "optical reception preamplifier" as shown in FIG. 7.

Referring to FIG. 7, the preamplifier is constituted of a signal amplifier 50 and a signal control circuit 51. For a purpose of eliminating amplitude differences in output data in relation to input data such as burst type input data, first, the signal reception circuit 50 receives an photocurrent signal or input current signal 13 from a photodiode 15. The photocurrent signal 13 is then supplied into an inverting amplifier 1 and into a buffer circuit 2 as an amplified signal. An output signal 14 from the buffer circuit 2 is compared with a reference voltage signal 12 inputted to a controller 8. The signal control circuit 51 also has a flip-flop circuit 11 actuated by a reset signal 41. According to a result of comparing the output signal 14 from the buffer circuit 2 with the reference voltage signal 12, a resistance value of an amplifier made up of the inverting amplifier 1 and buffer circuit 2 is altered by operation of transistors 5 and 6.

In consideration of the transimpedance-type amplifier circuit described above, the output signal 14 from the buffer circuit 2 is saturated when the value of the optical current signal 13 becomes high during a time required for interchanging the resistance. In the case of saturating the output signal 14, the electric charge increases with a parasitic capacitance 16 of the photodiode 15 since there is no current path through which the photocurrent signal 13 can flow from the photodiode 15. Thus, the output signal 14 from the transimpedance-type amplifier circuit 15 remains saturated if the electric charge of the parasitic capacitance 16 is not discharged, so that the photocurrent signal 13 may not be converted correctly as a photoelectric conversion used for optical communications and the like.

SUMMARY OF THE INVENTION

It is therefore an object of the present invention to provide a transimpedance-type amplifier circuit capable of avoiding saturation of an output signal from the amplifier circuit when the amplitude of an input signal into the amplifier circuit is high.

According to an aspect of the present invention, there is provided a transimpedance-type amplifier circuit which alters a feedback resistance constituted of a first resistor connected to a switching device and a second resistor connected with the first resistor in parallel with the switching device which is turned ON in accordance with a result obtained by comparing an output from an inverting amplifier with a reference voltage, wherein a diode is connected in parallel with the first resistor connected to the switching device.

With such a constitution, a terminal voltage across a newly connected resistor is kept constant by the diode. An optical current signal from a photodiode is is conducted to discharge the electric charge accumulated in the parasitic capacitance of the photodiode, thereby avoiding the saturation of an output signal from the transimpedance-type amplifier circuit.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Hereinafter, embodiments of the present invention will be described with reference to the drawings.

Figure 1:
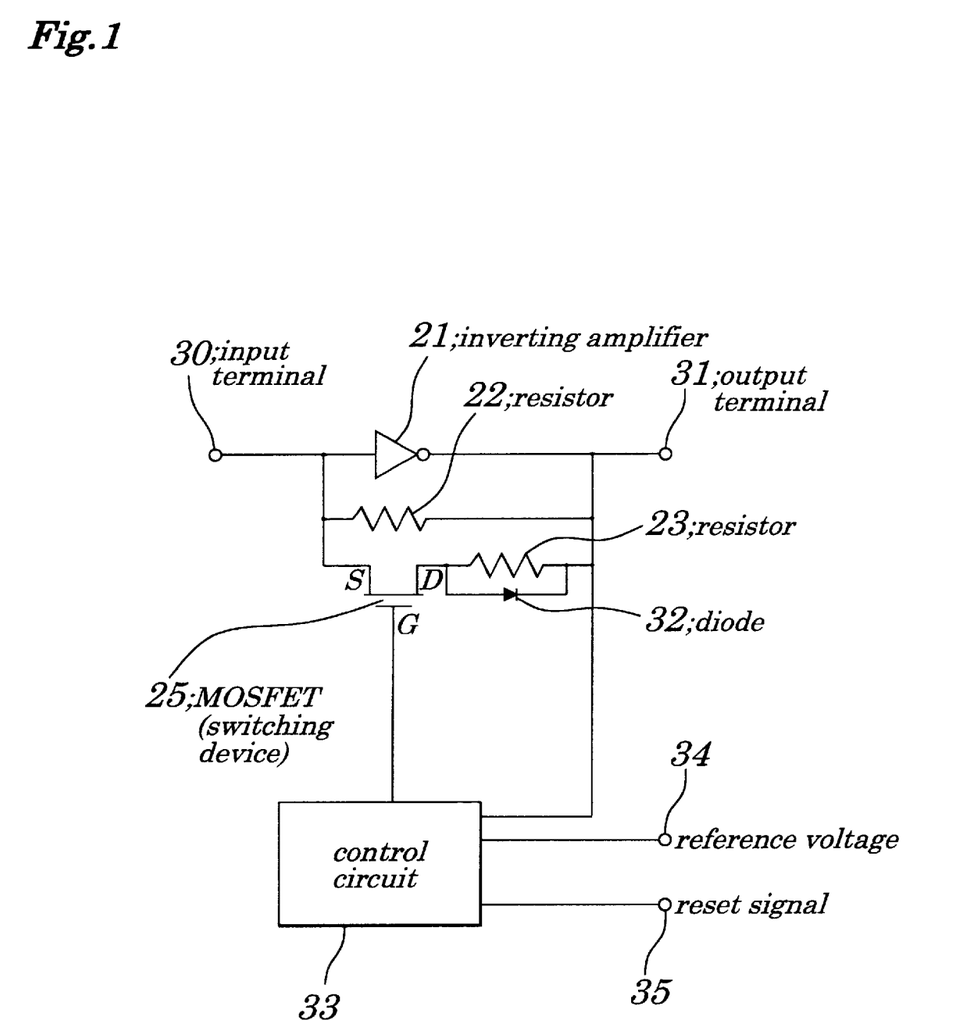
FIG. 1 is a circuit diagram showing a transimpedance-type amplifier circuit of an embodiment in the present invention.

FIG. 1 is a circuit diagram of a transimpedance-type amplifier circuit in an embodiment of the present invention. Referring to FIG. 1, an input terminal 30 is connected to an input of an inverting amplifier 21, to one end of a resistor 22, and to a source terminal S of a MOSFET (Metal Oxide Semiconductor-Field Effect Transistor) 25 operating as a switching device. A drain terminal D of MOSFET 25 is connected to one end of a resistor 23 and to an anode terminal of a diode 32. Both the other end of resistor 23 and a cathode terminal of diode 32 are connected to an output of the inverting amplifier 21 as well as the other end of resistor 22 the output of the inverting amplifier 21 which is connected to an output terminal 31. A control circuit 33 is connected with the output terminal 31 to receive the output of the inverting amplifier 21, and is also connected to a gate terminal G of MOSFET 25. The control circuit 33 also has a reference voltage terminal 34 connected to a reference voltage and a reset signal terminal 35 to receive a reset signal from another circuit. Accordingly, the control circuit 33 applies a gate voltage to the gate terminal G in response to a result of comparing the output signal from the inverting amplifier 21 at the output terminal 31 with the reference voltage at the reference voltage terminal 34.

The input terminal 30 as shown in FIG. 1 may be connected to an output of a photodiode as shown in FIG. 7, but may also be connected to an signal output of a detector, sensor and the like.

MOSFET 25 as shown in FIG. 1 is used as a switching device in this embodiment, but a bipolar transistor and the like may also be used instead of MOSFET. It is noted that a p-channel MOSFET is used in this case, but an n-channel MOSFET may be desirable because of the switching rate.

According to such constitution of the transimpedance-type amplifier circuit shown in FIG. 1, MOSFET 25 is turned ON when the gate voltage from the control circuit 33 is applied to the gate terminal G. This connects the resistors 22 and 23 in parallel, thereby interchanging the impedance of the transimpedance-type amplifier circuit. This also cause the input current from a photodiode (not shown in FIG. 1) to flow through the input terminal 30 and pass through the diode 32 connected in parallel to the resistor 23.

In the transimpedance-type amplifier circuit shown in FIG. 1, the values for components may be set as follows. The resistor 22 is 20 kΩ and resistor 23 is 20 kΩ. The value of reference voltage inputted from the reference voltage terminal 34 is set to 400 mV in the embodiment.

Figure 2:
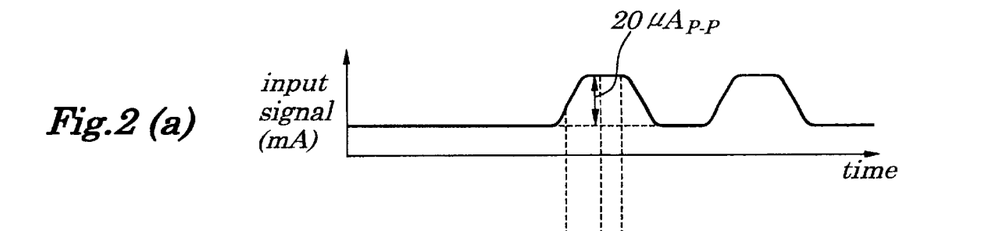
FIGS. 2(a), 2(b) and 2(c) are time charts showing a relationship between input and output signals.

FIGS. 2(a) to 2(c) are time charts for explaining the operation of the transimpedance-type amplifier circuit shown in FIG. 1. Referring to FIGS. 2(a) and 2(b), an operation of the amplifier circuit is activated by applying a reset signal to the reset terminal 35 from an outside source or another circuit. Then, when the amplitude of the input signal exceeds 20 $\mu A_{p-p}$ (or 20 $\mu A$ at peak to peak), MOSFET 25 is turned ON to present a combined resistance produced from resistors 22 and 23. When the amplitude of the input signal further exceeds more than 20 $\mu A_{p-p}$ and a voltage drop across resistor 23 becomes more than a forward voltage of diode 32, the diode 32 conducts and the amplitude of the output signal from the inverting amplifier 21 is clamped and saturated by the forward voltage of diode 32.

When the amplitude of the input signal exceeds 20 $\mu A_{p-p}$ and the output signal from the inverting amplifier 21 is detected by the control circuit 33 and also the amplitude of the output signal from the inverting amplifier 21 is less than the reference voltage supplied at the reference voltage terminal 34 at a time $t_1$, a gate voltage is applied to the gate terminal G of the n-channel MOSFET 25 output from the control circuit 33 with a delay caused by the detection. The n-channel MOSFET 25 is then turned on at a time $t_2$, thereby interchanging the impedance of the transimpedance-type amplifier circuit at a time $t_3$ after passing through transient state. Thus, after the time $t_3$ in relation to the waveform, the inverting amplifier 21 amplifies the input signal inversely with a reduced amplification factor, thereby operating the transimpedance-type amplifier circuit without saturation.

As shown in FIG. 2(c), an output signal S1 from the inverting amplifier 21 is quantized by another circuit which is not shown in FIG. 2(c), so that the photoelectric conversion may be carried out for an optical signal as an input signal used for optical communications.

Assuming that a maximum voltage level of output signal S1 is V1 shown in FIG. 2(c), a minimum voltage level thereof is V2 and a quantized voltage level is set to in between V1 and V2, a digital signal train "101" is obtained by the output signal S1. However, it is noted that the output signal remains saturated after the time $t_2$ in the case where the diode 32 is not connected across the resistor 23. In this case, a digital signal train "111" is only produced from the transimpedance-type amplifier circuit even though a saturated output signal S2 shown in FIG. 2(c) is quantized, causing the photoelectric conversion to generate errors in an optical signal used for optical communications.

Figure 3:
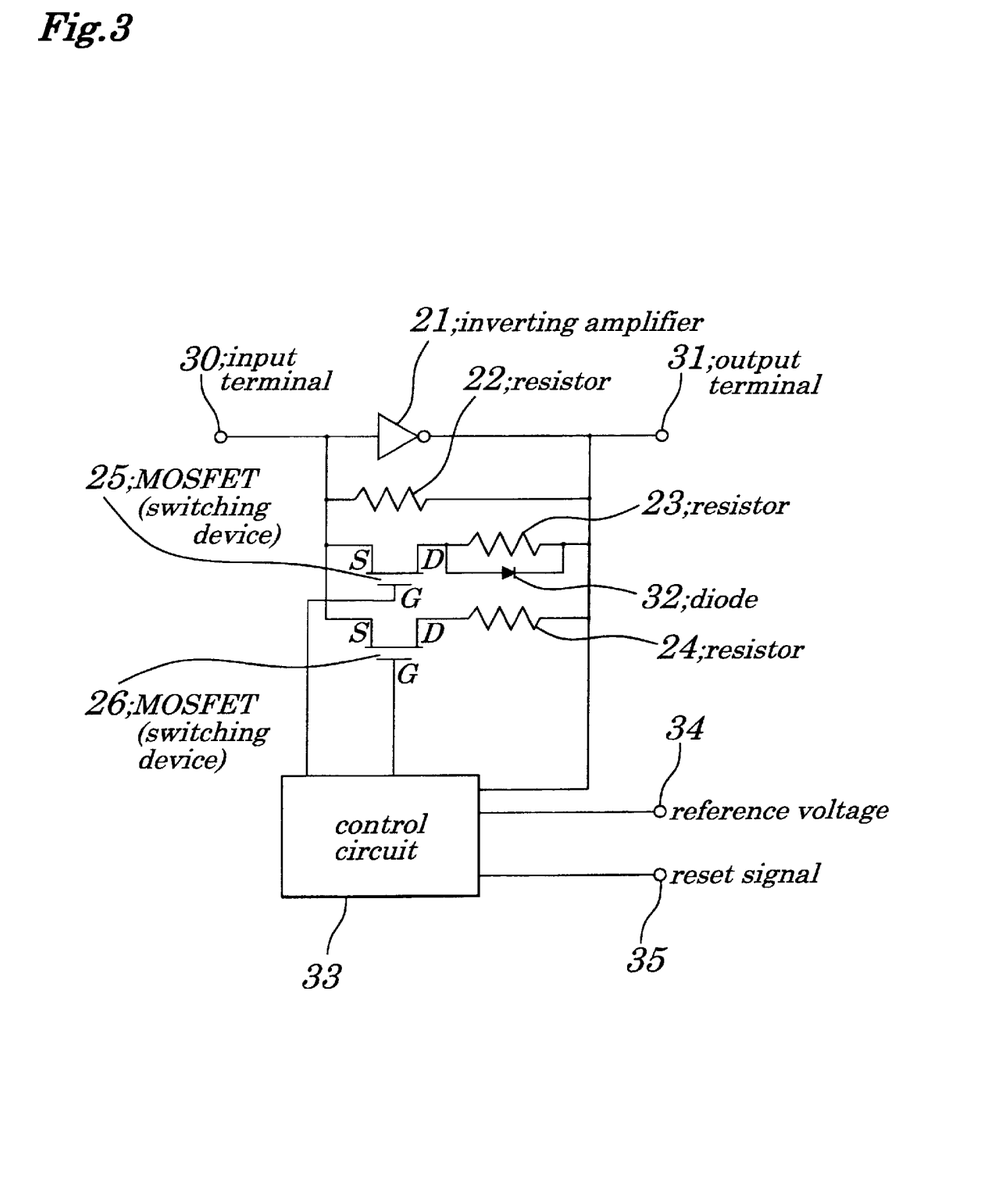
FIG. 3 is a circuit diagram showing a transimpedance-type amplifier circuit capable of interchanging a feedback resistance in three stages in another embodiment of the present invention.

FIG. 3 is a circuit diagram showing a transimpedance-type amplifier circuit capable of interchanging the resistance in three stages in another embodiment of the present invention.

Referring to FIG. 3, an input terminal 30 is connected to an input of an inverting amplifier 21, to one end of a resistor 22, to a source terminal S of a MOSFET 25 as a switching device and also to a source terminal S of MOSFET 26. A drain terminal D of MOSFET 25 is connected to one end of a resistor 23 and to an anode terminal of a diode 32. Both the other end of resistor 23 and a cathode terminal of diode 32 are connected to an output of the inverting amplifier 21 as well as the other end of resistor 22. A drain terminal D of MOSFET 26 is connected to one end of a resistor 24, and the other end of the resistor 24 is connected to the output of inverting amplifier 21 at output terminal 31. A control circuit 33 is connected to both gate terminals G of MOSFETs 25, 26 to apply gate voltages, respectively thereto. The control circuit 33 also has a reference voltage terminal 34 to input a reference voltage, and a reset terminal 35 to receive a reset signal from an outside source or another circuit.

In the transimpedance-type amplifier circuit shown in FIG. 3, the values for components may be set as follows. The resistor 22 is 20 kΩ, resistor 23 is 20 kΩ and resistor 24 is 2.5 kΩ. The value of reference voltage inputted from the reference voltage terminal 34 may be set to 200 mV. DC voltage on the output terminal 31 may be 1.0 volt generally when no signal is emerged thereon.

According to such values set to the transimpedance-type amplifier circuit, the interchange of resistance may be carried out as follows. The resistor 22 is selected when the input signal from input terminal 30 is equal to or less than 20 $\mu A_{p-p}$ as a first interchange level, the resistors 22 and 23 are selected when the input signal is present between the first interchange level 20 $\mu A_{p-p}$ and a second interchange level 40 $\mu A_{p-p}$, and the resistors 22, 23 and 24 are selected when the input signal level is equal to or greater than the second interchange level.

Figure 4:
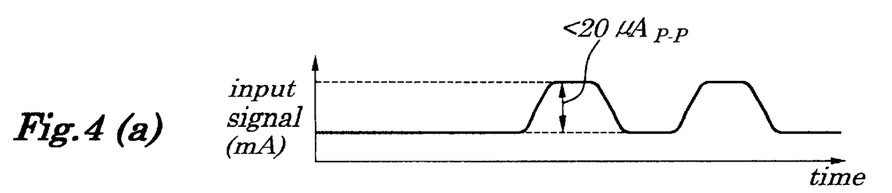
FIGS. 4(a), 4(b), 4(c), 4(d) and 4(e) are time charts showing a relationship between input and output signals at the time when the feedback resistance is in the first stage.

FIGS. 4(a) to 4(e) are waveform diagrams showing a case where the input signal from the input terminal 30 is less than the first interchange level or 20 $\mu A_{p-p}$ as shown in FIG. 4(a). In this case, since the output signal shown in FIG. 4(c) from the inverting amplifier 21 is not less than the reference voltage, the control circuit 33 is not actuated to interchange the impedance of the transimpedance-type amplifier circuit. FIG. 4(b) shows a reset signal the same as described above with reference to FIG. 2(b). FIGS. 4(d) and 4(e) show signals 1 and 2 as DC voltages applied to the gate terminals of MOSFETs 25 and 26.

Figure 5:
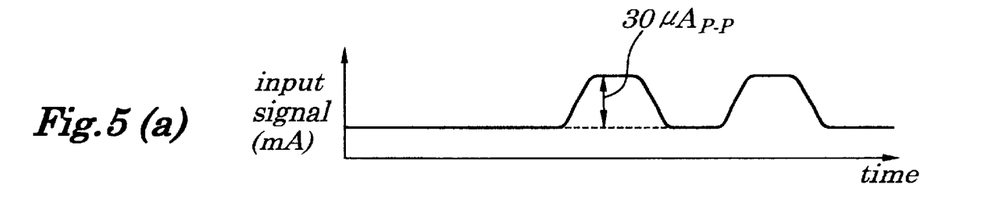
FIGS. 5(a), 5(b), 5(c), 5(d) and 5(e) are time charts showing a relationship between input and output signals at the time when the feedback resistance is in the second stage.

FIGS. 5(a) to 5(e) are waveform diagrams showing a case where a combined resistance 10 kΩ produced from the resistors 22 and 23 is selected by the control circuit 33 as the interchanged impedance. When an input signal 30 $\mu A_{p-p}$ shown in FIG. 5(a) is supplied to the input terminal 30 after the reset signal shown in FIG. 5(b) is supplied to into the reset terminal 35, the level of output signal shown in FIG. 5(c) becomes 400 m$V_{p-p}$ at a time of rising from 20 $\mu A_{p-p}$ with respect to the input signal 30 $\mu A_{p-p}$, actuating the control circuit 33. The control circuit 33 applies a signal 1 shown in FIG. 5(d) to the gate terminal G of MOSFET 25 to be turned ON, causing an impedance to interchange from the resistance 20 kΩ to 10 kΩ produced by the combined resistance of resistors 22 and 23. When both the MOSFETs 25 and 26 are in off-states, the resistance is set to 20 Ω of resistance 22. FIG. 5(e) shows a signal 2 as a DC level to be applied to the gate terminal G of MOSFET 26 for interchanging the resistance in a third stage.

With a delay produced up to interchanging the impedance, an output signal 600 m$V_{p-p}$ as shown in FIG. 5(c) is produced at the output terminal 31 until the resistance is altered from resistance 20 kΩ to 10 kΩ. The output signal 300 mV$_{p-p}$ is produced at the output terminal 31 after interchanging the impedance. Subsequently, the output signal is produced in accordance with the logical value of the input signal.

Figure 6:
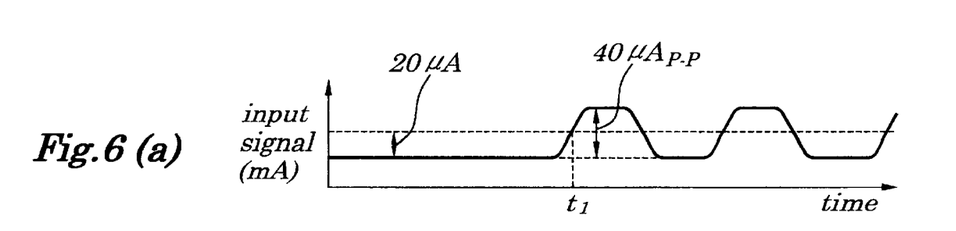
FIGS. 6(a), 6(b), 6(c), 6(d) and 6(e) are time charts showing a relationship between input and output signals at the time when the feedback resistance is in the third stage.

FIGS. 6(*a*) to 6(*e*) are waveform diagrams showing a case where the amplitude of input signal shown in FIG. 6(*a*) is more than 40 μA$_{p-p}$. With the reset signal shown in FIG. 6(*b*) applied to the reset terminal 35, the control circuit 33 applies a signal 1 shown in FIG. 6(*d*) to the gate terminal G of MOSFET 25 to be turned ON, interchanging an impedance to change the resistance from 20 kΩ to 10 kΩ at the time t$_1$ when exceeding 20 μA$_{p-p}$ on the amplitude 40 μA$_{p-p}$. The amplitude of the output signal from the inverting amplifier 21 continues falling as shown in FIG. 6(*c*) while interchanging the impedance. When the amplitude of the output signal exceeds 700 mV$_{p-p}$, a voltage difference between the input terminal 30 and output terminal 31 is 0 volt with the diode 32 holding the forward voltage due to the conduction of diode 32, regardless of the amplitude of the input signal. Thus, the transimpedance-type amplifier circuit does not become saturated. After interchanging the resistance to 10 kΩ, even saturation does not occur with a current down through the diode 32.

Subsequently, when the input signal is returned to a logical value 0 from 1, the output signal returns to 1.0 volt. When the input signal is again returned to a logical value 1 from 0, the output signal is 2.0 V$_{p-p}$ due to the input signal 200 mV$_{p-p}$ at the resistance 10 kΩ. When the output signal is reached 400 mV, the control circuit 33 stops applying the signal 1 to the gate terminal G of MOSFET 25 to be turned OFF, causing the impedance to interchange the resistance from 10 kΩ to 2 kΩ. At this time, the amplitude of the output signal continues rising up to the termination of interchanging the impedance, but does not rise over 700 mV$_{p-p}$ due to the conduction of diode 32, so that saturation does not occur. As a result, the transimpedance-type amplifier circuit operates normally even after interchanging the resistance from 10 kΩ to 2 kΩ.

When a subsequent input signal is supplied to the input terminal 30, the control circuit 33 applies a signal 2 shown in FIG. 6(*e*) to the gate terminal G of MOSFET 26 to be turned ON, interchanging the impedance to another value in a third stage. The operation of impedance interchange for the third stage is similar to the first and second stages, therefore, its detailed explanation is omitted.

According to the transimpedance-type amplifier circuits shown in FIGS. 1 and 3, these amplifier circuits may be incorporated in a one-chip integrated circuit.

It is apparent that the present invention is not limited to the above embodiments but may be changed and modified without departing from the scope and spirit of the invention.

Finally, the present application claims the priority of Japanese Patent Application No. Hei10-147969 filed on May 28, 1998, which is herein incorporated by reference.

What is claimed is:

1. A transimpedance-type amplifier circuit altering a feedback resistance constituted of a first resistor connected to a switching device and a second resistor connected with said first resistor in parallel with said switching device which is turned ON in accordance with a result obtained by comparing an output from an inverting amplifier with a reference voltage, wherein;

a diode is connected in parallel with said first resistor connected to said switching device.

2. A transimpedance-type amplifier circuit according to claim 1, wherein; an input of said inverting amplifier is connected to a photodetector to receive an input current signal from the photodetector which flows through said diode for discharging an electric charge accumulated in a parasitic capacitance of said photodetector, when said switching device is turned ON.

3. A transimpedance-type amplifier circuit including an inverting amplifier having a feedback resistance and a control circuit for altering a value of said feedback resistance, wherein;

the feedback resistance includes at least one switching device, a resistor connected to said at least one switching device and a diode connected in parallel to said resistor, wherein;

said control circuit produces a control signal for turning said at least one switching device ON in accordance with a result obtained by comparing an output from said inverting amplifier with at least one reference voltage, and wherein;

said control circuit starts an operation with a reset signal received from an outside source after receiving an output signal from said inverting amplifier.

4. A transimpedance-type amplifier circuit according to claim 3, wherein; said feedback resistance comprises a switching device, a first resistor connected to said switching device, a diode connected in parallel to said first resistor and a second resistor connected in parallel with said first resistor.

5. A transimpedance-type amplifier circuit according to claim 3, wherein; said feedback resistance comprises a first switching device, a first resistor connected to said first switching device, a diode connected in parallel to said first resistor, a second resistor connected in parallel with said first resistor, a second switching device, and a third resistor connected to said switching device.

6. A transimpedance-type amplifier circuit according to claim 3 wherein an input of said inverting amplifier is connected to a photodetector to receive an input current signal from the photodetector which flows through said diode for discharging an electric charge accumulated in a parasitic capacitance of said photodetector, when said switching device is turned ON.

7. A transimpedance-type amplifier circuit including a photodetector, an inverting amplifier receiving an output signal of said photodetector and a control circuit altering a value of a feedback resistance means in relation to said inverting amplifier, wherein;

said feedback resistance includes at least one switching device, a resistor connected to said switching device and a diode corrected in parallel to said resistor, wherein;

said control circuit produces a control signal for turning said switching device ON in accordance with a result obtained by comparison of an output from said inverting amplifier with at least one reference voltage, and wherein;

said control circuit starts an operation with a reset signal received from an outside source after receiving an output signal from at least said inverting amplifier.

8. A transimpedance-type amplifier circuit according to claim 7, wherein; said feedback resistance comprises a switching device, a first resistor connected to said switching device, a diode connected in parallel to said first resistor and a second resistor connected in parallel with said first resistor.

9. A transimpedance-type amplifier circuit according to claim 7, wherein; said feedback resistance comprises a first switching device, a first resistor connected to said first switching device, a diode connected in parallel to said first resistor, a second resistor connected in parallel with said first resistor, a second switching device, and a third resistor connected to said switching device.

10. A transimpedance-type amplifier circuit according to claim 7, wherein; an input of said inverting amplifier is connected to a photodetector to receive an input current signal from the photodetector which flows through said diode for discharging an electric charge accumulated in a parasitic capacitance of said photodetector, when said switching device is turned ON.

* * * * *